(12) United States Patent
Chang et al.

(10) Patent No.: US 10,023,459 B2
(45) Date of Patent: Jul. 17, 2018

(54) MEMS AND METHOD FOR FORMING THE SAME

(71) Applicant: Taiwan Semiconductor Manufacturing Company, Ltd., Hsin-Chu (TW)

(72) Inventors: Kuei-Sung Chang, Kaohsiung (TW); Ting-Hau Wu, Yilan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 849 days.

(21) Appl. No.: 13/860,759

(22) Filed: Apr. 11, 2013

(65) Prior Publication Data

US 2015/0353342 A1    Dec. 10, 2015

Related U.S. Application Data

(60) Provisional application No. 61/776,504, filed on Mar. 11, 2013.

(51) Int. Cl.
| | |
|---|---|
| *H01L 29/84* | (2006.01) |
| *B81B 3/00* | (2006.01) |
| *B81C 1/00* | (2006.01) |

(52) U.S. Cl.
CPC ........... *B81B 3/001* (2013.01); *B81B 3/0013* (2013.01); *B81B 3/0016* (2013.01); *B81C 1/0096* (2013.01); *B81C 1/00484* (2013.01); *B81C 1/0015* (2013.01); *B81C 1/0019* (2013.01); *B81C 1/00134* (2013.01); *B81C 1/00142* (2013.01); *B81C 1/00468* (2013.01); *B81C 1/00936* (2013.01); *H01L 2924/1461* (2013.01)

(58) Field of Classification Search
CPC ...... B81B 3/00; B81B 2201/0228–2201/0292; H01L 2924/1461; B81C 1/00928; B81C 1/00936; B81C 1/0096
See application file for complete search history.

(56) References Cited

U.S. PATENT DOCUMENTS

| | | | | |
|---|---|---|---|---|
| 5,364,497 A | * | 11/1994 | Chau | ..... B81C 1/0092 216/39 |
| 5,658,636 A | * | 8/1997 | Reed | ..... B81B 3/0013 324/207.13 |

(Continued)

*Primary Examiner* — Jesse Y Miyoshi
*Assistant Examiner* — Tuan A Hoang
(74) *Attorney, Agent, or Firm* — Slater Matsil, LLP

(57) ABSTRACT

A method and apparatus are provided to prevent or reduce stiction of a MEMS device. The MEMS device may include a protrusion extending from a surface of the MEMS device. During manufacture, the protrusion may be connected across an opening in the MEMS device to a sidewall of the substrate. Before manufacture of the MEMS device is completed, at least a portion of the protrusion connecting the MEMS device to the substrate may be removed. During operation, the protrusion may provide stiction prevention or reduction for the surface from which the first protrusion may extend. A plurality of protrusions may be formed along a plurality of surfaces for the MEMS device to prevent or reduce stiction along the corresponding surfaces. Protrusions may also be formed on devices surrounding or encapsulating the MEMS device to prevent or reduce stiction of the MEMS device to the surrounding or encapsulating devices.

20 Claims, 12 Drawing Sheets

(56) References Cited

U.S. PATENT DOCUMENTS

| | | | | |
|---|---|---|---|---|
| 5,723,353 | A * | 3/1998 | Muenzel | G01P 3/48 |
| | | | | 148/DIG. 135 |
| 6,276,207 | B1 * | 8/2001 | Sakai | B81B 3/0008 |
| | | | | 73/514.16 |
| 6,423,563 | B2 * | 7/2002 | Fukada | B81B 3/0005 |
| | | | | 257/419 |
| 6,528,724 | B1 * | 3/2003 | Yoshida | B81C 1/0015 |
| | | | | 174/541 |
| 6,753,638 | B2 * | 6/2004 | Adams | H02N 1/008 |
| | | | | 310/309 |
| 6,856,446 | B2 | 2/2005 | DiCarlo | |
| 7,258,011 | B2 * | 8/2007 | Nasiri | G01P 1/023 |
| | | | | 73/510 |
| 2002/0131682 | A1 * | 9/2002 | Nasiri | B81B 3/0062 |
| | | | | 385/18 |
| 2003/0146464 | A1 * | 8/2003 | Prophet | B81B 3/001 |
| | | | | 257/306 |
| 2009/0140356 | A1 * | 6/2009 | Yazdi | B81C 1/00253 |
| | | | | 257/415 |
| 2010/0122579 | A1 * | 5/2010 | Hsu | G01P 15/125 |
| | | | | 73/514.32 |

* cited by examiner

MEMS AND METHOD FOR FORMING THE SAME

CROSS-REFERENCE TO RELATED APPLICATIONS

This application claims priority to U.S. Provisional Application Ser. No. 61/776,504, filed on Mar. 11, 2013, entitled "Method and Apparatus to Reduce MEMS Stiction," which application is hereby incorporated by reference herein.

BACKGROUND

In a semiconductor manufacturing process, integrated circuits (also referred to as "dies") are fabricated in a die area on a semiconductor wafer. The semiconductor wafer goes through many processing steps before the dies are separated by cutting the semiconductor wafer. The processing steps can include lithography, etching, doping, grinding, blade cutting, die-sawing and/or depositing different materials. The processing steps can include wet and dry processing steps. Semiconductor wafers and/or separated dies can be stacked or bonded on top of each other to form a three-dimensional ("3D") IC. For example, a semiconductor wafer, which may or may not include electrical devices, can be bonded to another semiconductor wafer having micro electrical-mechanical system ("MEMS") devices formed therein. After bonding, the wafers are cut or separated into bonded dies, which may consist of devices from both wafers.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments. Throughout the various views and illustrative embodiments, like reference numbers are used to designate like elements.

Different types of MEMS devices may include, but not be limited to, a suspended structure, such as, for example, a vibrating mass, elastic strings or coils for performing functions in sensors, gyroscopes, accelerometers or the like. During manufacture of a MEMS device, the MEMS device may become stuck or adhered to a side or surface of a wafer, die or substrate that may be near, surrounding or enclosing the MEMS device. A MEMS device may also become stuck to a side or surface of a die or substrate that may be near, surrounding or enclosing the MEMS device during operation of a chip that may include the MEMS device. The sticking or adherence of a MEMS device to a wafer, die or substrate surrounding the MEMS device is often referred to as "stiction." Embodiments discussed herein describe various methods and/or apparatuses for preventing or reducing stiction of a MEMS device to a wafer, die or substrate that may be near, surrounding or enclosing the MEMS device during manufacture and/or during operation of the MEMS device.

Figure 1A:
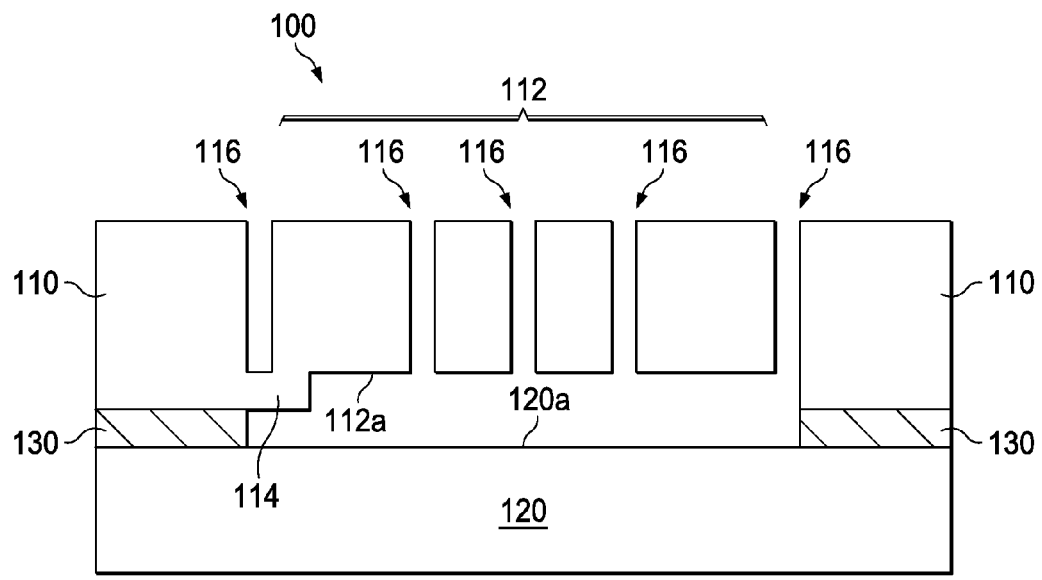
FIGS. 1A-1B illustrate configurations of a protrusion according to an embodiment.
Figure 1B:
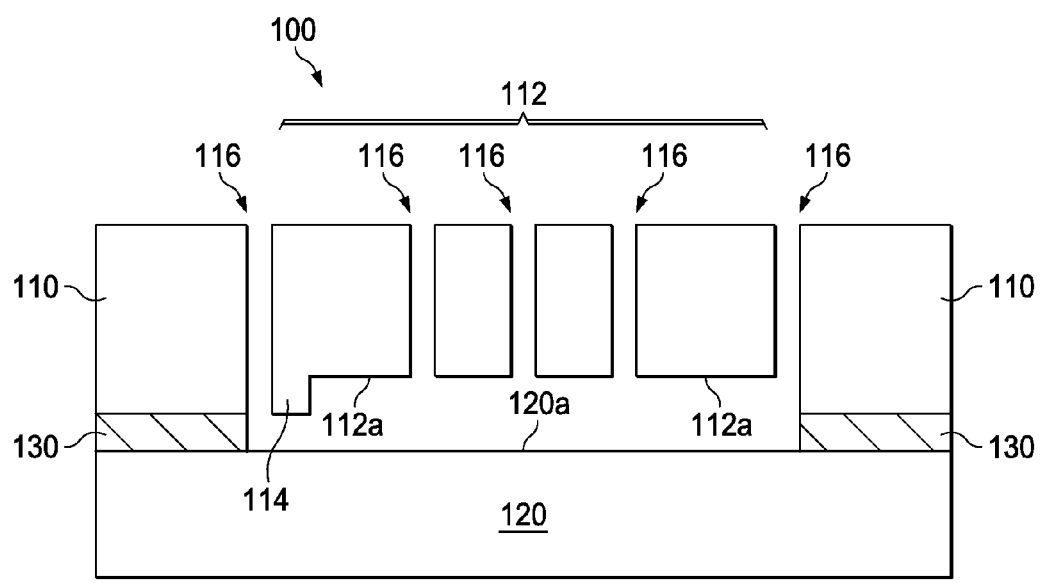

FIGS. 1A-1B illustrate configurations of a protrusion 114 according to an embodiment. FIG. 1A illustrates a configuration of the protrusion 114 during manufacture of a structure 100. As illustrated in FIGS. 1A-1B, the structure 100 may include a first substrate 110 bonded to a second substrate 120 through a bonding layer 130. The first substrate 110 may include one or more MEMS device(s) 112 and a protrusion 114 extending from a first surface 112*a* of the MEMS device(s) 112 to a surrounding area of the first substrate 110. The protrusion 114 may prevent or reduce stiction between the MEMS device 112 and the second substrate 120 during manufacture of the structure 100 and during operation of the MEMS device 112.

The second substrate 120 may have a first surface 120*a*. The first surface 112*a* of the MEMS device 112 may be separated from the first surface 120*a* of the second substrate 120. The MEMS device 112 may include one or more trenches 116. The trenches 116 are shown as extending through the MEMS device 112 for illustrative purposes only. The trenches 116 may extend through portions of the MEMS device 112 to enable the MEMS device 112 to actuate or move during operation in a first and/or a second direction within the structure 100. For example, the MEMS device 112, as shown in FIGS. 1A-1B may be an actuator. The protrusion 114 may extend across a trench 116 to connect the MEMS device 112 to a sidewall of the first substrate 110 that may be adjacent to the MEMS device.

During manufacture of the structure 100, a portion of the protrusion 114, as shown in FIG. 1A, may extend to the first substrate 110 thereby coupling or securing the protrusion 114 and the MEMS device 112 to the first substrate 110. In an embodiment, the protrusion 114 may be made of a same material as the first substrate 110. The protrusion 114 may stabilize the MEMS device 112 to the first substrate 110 thereby limiting movement of the MEMS device 112 within the structure 100 throughout various processes during manufacture of the structure 100. Such processes may include, for example, etching, grinding, dicing, sawing, polishing and/or doping the first and/or the second substrate 110, 120; depositing, forming, and/or patterning of dielectric and/or metallization layers (not shown) on and/or within the first and/or second substrate 110, 120; forming electrical devices (not shown) on and/or within the first and/or second substrate 110, 120 or other processes.

By stabilizing the MEMS device 112 to the first substrate 110, the protrusion 114 may prevent or reduce stiction between the MEMS device 112 and the first and second substrates 110, 120 during manufacture of the structure 100.

Before manufacture of the structure 100 is completed, the portion of the protrusion 114 connected to the first substrate 110 may be removed. The portion connected to the first substrate 110 may be removed using processes such as, for example, wet or dry etching, which may include chemical etching, reactive ion etching ("RIE"), combinations thereof or the like.

The protrusion 114 may also prevent or reduce stiction between the MEMS device 112 and the first and/or second substrate 110, 120 during operation of the MEMS device 112. FIG. 1B illustrates a configuration of the protrusion 114 during operation of the MEMS device 112. The protrusion 114, as shown in FIG. 1B, may have a first surface 114a. The first surface 114a of the protrusion 114 may have a surface area smaller than the first surface 112a of the MEMS device 112. Since the protrusion 114 may have a smaller surface area than the MEMS device 112, the protrusion 114 may reduce the likelihood that the MEMS device 112 may become stuck or adhered to the second substrate 120 during operation as compared to the likelihood that first surface 112a of the MEMS device 112 may itself become stuck or adhered to the first surface 120a of the second substrate in the absence of the protrusion 114.

As noted above, the MEMS device 112 may move or actuate during operation in a first and/or second direction within the structure 100. The first direction may be, for example, a vertical direction such that the MEMS device 112 moves vertically within the structure 100, e.g., perpendicular to the first surface 112a of the MEMS device 112. The protrusion 114 may prevent or reduce stiction between the first surface 112a of the MEMS device 112 and the first surface 120a of the second substrate 120.

The stiction prevention or reduction that the protrusion 114 may provide with regard to the first surface 112a of the MEMS device 112 may prevent or reduce stiction along a plane or surface from which the protrusion 114 may extend. In FIG. 1B, the protrusion 114 may prevent or reduce stiction for the first surface 112a of the MEMS device 112 as the protrusion may extend from the first surface 112a.

The MEMS device 112 may also move in a second direction. The second direction may, for example, be a horizontal direction such that the MEMS device 112 may move horizontally within the first substrate 110, e.g., horizontally from left to right within the first substrate 110 shown in FIGS. 1A-1B. Other protrusion configurations, discussed in more detail below, may prevent or reduce stiction between a MEMS device and a first, second, and/or third substrate (e.g., a third substrate overlying the first substrate) that may surround or encapsulate the MEMS device.

In various embodiments the first substrate 110 may be bonded to the second substrate 120 using bonding processes, such as, for example, eutectic or fusion bonding processes. In various embodiments, the bonding layer 130 may be formed of a eutectic bonding material such as, for example, a eutectic alloy such as AlCu, AlGe or a low-melting point metal layer tin, silver, gold, lead, aluminum, titanium, copper, lead-free solder, alloys thereof or the like. Eutectic alloys or low-melting point metal layers may be formed by thermal chemical vapor deposition ("CVD"), physical vapor deposition ("PVD") such as sputtering or evaporation, electron gun, ion beam, energy beam, plating, one or more subtractive etch processes, single damascene techniques, and/or dual-damascene techniques, the like or other acceptable methods. In various embodiments, the bonding layer 130 may be formed of a fusion bonding material such as a silicon-based, ceramic-based, quartz-based material, an insulating layer or the like. In an embodiment, a third substrate (not shown) may be bonded over the first substrate 110 to enclose or encapsulate the MEMS device 112. Bonding a third substrate over the first substrate 110 is discussed in more detail below with regard to FIGS. 5D and 6E.

Although not illustrated in FIGS. 1A-1B, the second substrate 120 may have formed therein a recess in an area of the second substrate 120 opposite the MEMS device 112. In various embodiments, the first and/or second substrate 110, 120 may be a wafer, die, interposer, any semiconductor substrate, ceramic substrate, quartz substrate, multi-layered substrates, gradient substrates, or hybrid orientation substrates or the like. In some embodiments, the first and/or second substrate 110, 120 may comprise a silicon-on-insulator ("SOI") or other like substrate. In various embodiments, the first and/or second substrates may include dielectric layers, metallization layers, interconnects (all not shown), combinations thereof or the like. In various embodiments, semiconductor materials may be used to provide interconnects. In various embodiments, the first and/or second substrate 110, 120 may include active electrical devices (not shown) such as, for example, transistors, diodes, integrated circuits or the like. In various embodiments, the first and/or second substrate 110, 120 may include passive devices (not shown) such as, for example, resistors, capacitors, inductors or the like.

Figure 2A:
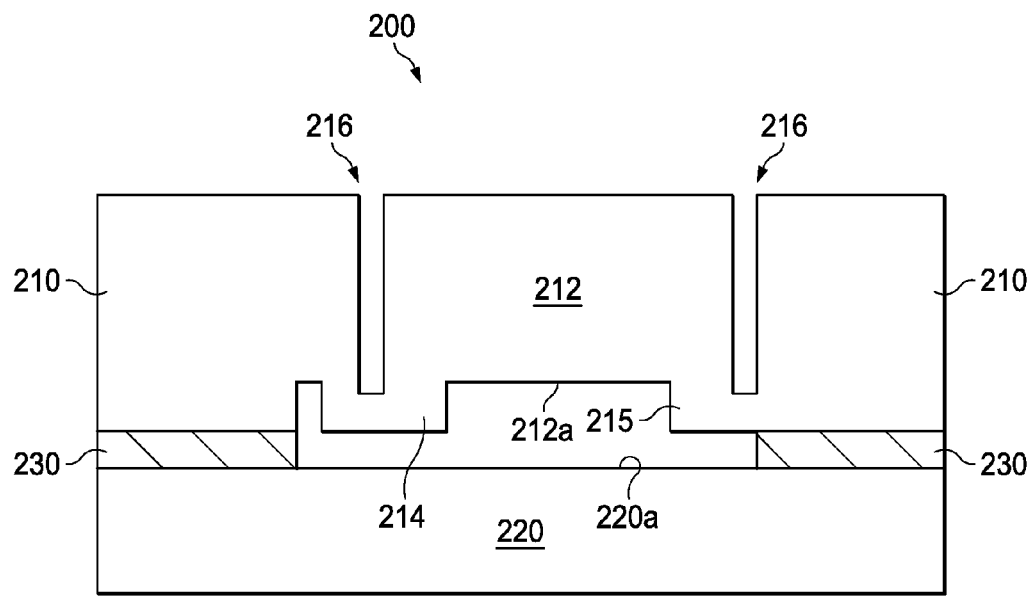
FIGS. 2A-2B illustrate configurations of a pair of protrusions according to an embodiment.
Figure 2B:
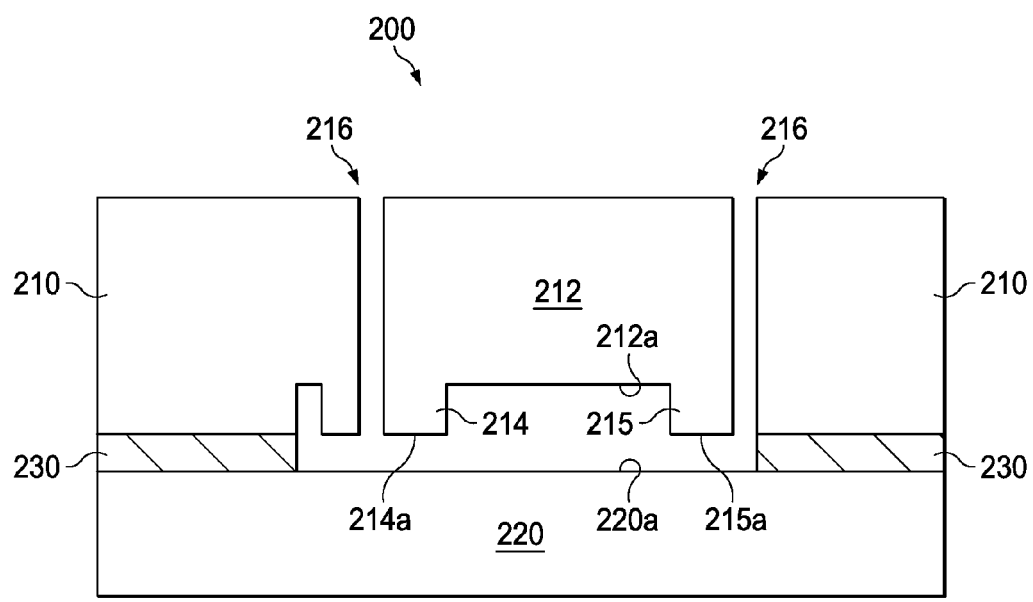

FIGS. 2A-2B illustrates configurations of a pair of protrusions 214, 215 according to an embodiment. FIG. 2A illustrates a configuration of the pair of protrusions 214, 215 during manufacture of a structure 200. As illustrated in FIGS. 2A-2B, the structure 200 may include a first substrate 210 bonded to a second substrate 220 through a bonding layer 230. The first substrate 210 may include one or more MEMS device(s) 212, a first protrusion 214 extending from a first surface 212a of the MEMS device 212 and a second protrusion 215 extending from the first surface 212a of the MEMS device 212.

The first and second protrusions 214, 215 may prevent or reduce stiction between the MEMS device 212 and the first and second substrates 210, 220 during manufacture of the structure 200 and during operation of the MEMS device 212. FIG. 2B illustrates a configuration of the first protrusion 214 following manufacture, for example, during operation of the MEMS device 212. It should be noted that the first substrate 210, the second substrate 220, and/or the bonding layer 230 may have similar characteristics and/or compositions as those described for the corresponding components as described in FIGS. 1A-1B.

The second substrate 220 may have a first surface 220a. The first surface 212a of the MEMS device 212 may be separated from the first surface 220a of the second substrate 220. The MEMS device 212 may include one or more trenches 216. The trenches 216 are shown as extending through the MEMS device 212 for illustrative purposes only. In practice, the trenches 216 may extend through portions of the MEMS device 212 to enable the MEMS device 212 to actuate or move during operation in a first and/or a second direction within the structure 200. The movement of the MEMS device 212 during operation is discussed in more detail below with regard to FIG. 2B.

During manufacture of the structure 200, a portion of the first protrusion 214 may extend to the first substrate 210 thereby coupling or securing the first protrusion 214 and the MEMS device 212 to the first substrate 210. The first protrusion 214 may extend across a trench 216 to connect the MEMS device 212 to a sidewall of the first substrate 210 that may be adjacent to the MEMS device 212. In an embodiment, the first protrusion 214 may be made of a same material as the first substrate 210. A portion of the second protrusion 215 may extend from the second protrusion 215 to the first substrate 210 to further couple or secure the MEMS device 212 to the first substrate 210. The second protrusion 215 may extend across another trench 216 to connect the MEMS device 212 to another sidewall of the first substrate 210 that may be adjacent to the MEMS device 212. In an embodiment, the second protrusion 215 may be made of a same material as the first substrate 210.

The first and second protrusions 214, 215 may stabilize the MEMS device 212 to the first substrate 210 thereby limiting movement of the MEMS device 212 within the structure 200 during manufacture processing of the structure. Such processing may include, for example, etching, grinding, dicing, sawing, polishing and/or doping the first and/or the second substrate 210, 220; depositing, forming, and/or patterning of dielectric and/or metallization layers (not shown) on and/or within the first and/or second substrate 210, 220; forming electrical devices (not shown) on and/or within the first and/or second substrate or other processes.

By stabilizing the MEMS device 212 to the first substrate 210, the first and second protrusions 214, 215 may prevent or reduce stiction between the MEMS device 212 and the first and second substrates 210, 220 during manufacture of the structure 200. Before manufacture of the structure 200 is completed, the corresponding portions of the first and second of the first and second protrusions 214, 215 may be removed. The portions may be removed using processes such as, for example, wet or dry etching, which may include chemical etching, RIE, combinations thereof or the like.

The first and second protrusions 214, 215 may also prevent or reduce stiction between the MEMS device 212 and the first and second substrates 210, 220 during operation of the MEMS device 212. FIG. 2B illustrates a configuration of the first and second protrusions 214, 215 during operation of the MEMS device 212. The first protrusion 214, as shown in FIG. 2B, may have a first surface 214a. The first surface 214a of the first protrusion 214 may have a surface area smaller than the first surface 212a of the MEMS device 212. The second protrusion 215 may have a second surface 215a. The second surface 215a of the second protrusion 215 may have a surface area smaller than the first surface 212a of the MEMS device 212.

Since each of the first surface 214a and the second surface 215a of the corresponding first and second protrusions 214, 215 maybe smaller than the first surface 212a of the MEMS device 212, the first and second protrusions 214, 215 may reduce the likelihood that the MEMS device 212 may become stuck or adhered to the second substrate 220 as compared to the likelihood that first surface 212a of the MEMS device 212 may itself become stuck or adhered to the second substrate 202 in the absence of the first and second protrusions 214, 215. Thus, the first and second protrusions 214, 215 may prevent or reduce stiction for the first surface 212a of the MEMS device 212 during operation. For example, the first and second protrusions 214, 215 may prevent or reduce stiction between the first surface 212a of the MEMS device 212 and the the second substrate 220 for vertical vibrations, movement or rotation that the MEMS device 212 may experience during operation.

FIGS. 3A-5F illustrate various additional configurations of protrusions according to various embodiments. The discussions of various first substrates, second substrates, MEMS devices, and/or bonding layers as illustrated in FIGS. 3A-5F may be abridged for purposes of brevity, however, it should be noted that the characteristics and/or compositions of these components may be similar to those as described for related components as illustrated in FIGS. 1A-2B.

Figure 3A:
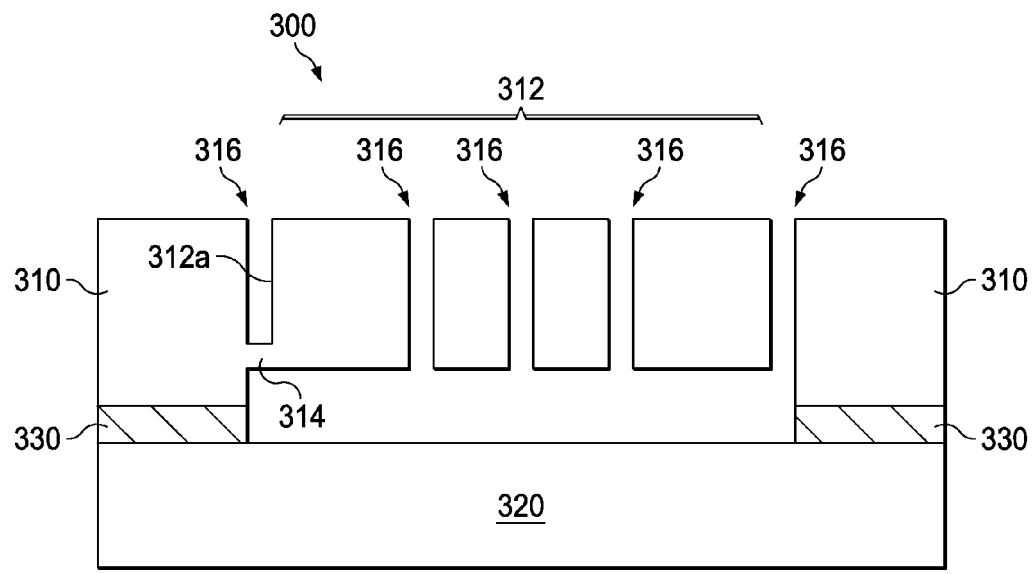
FIGS. 3A-3B illustrate configurations of another protrusion according to an embodiment.
Figure 3B:
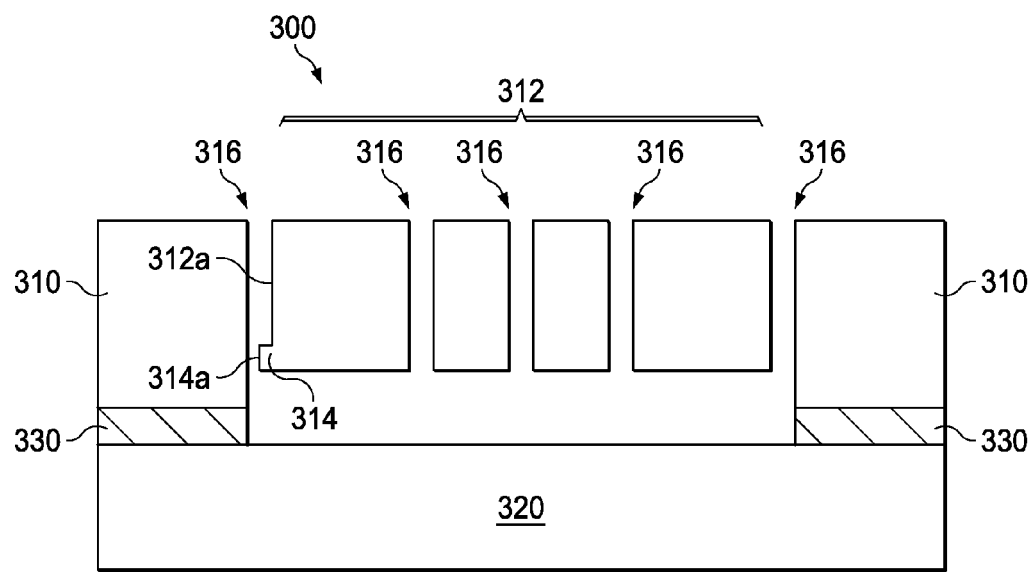

FIGS. 3A-3B illustrate configurations of another protrusion 314 according to an embodiment. FIG. 3A illustrates a configuration of the protrusion 314 during manufacture of a structure 300. As illustrated in FIGS. 3A-3B, the structure 300 may include a first substrate 310 bonded to a second substrate 320 through a bonding layer 330. The first substrate 310 may include one or more MEMS device(s) 312 and a protrusion 314 extending from a first surface 312a of the MEMS device(s) 312. The protrusion 314 may prevent or reduce stiction between the MEMS device 312 and the first and second substrates 310, 320 during manufacture of the structure 300 and during operation of the MEMS device 312 following manufacture. One or more trenches 316 may be formed in the MEMS device 312. FIG. 3B illustrates a configuration of the protrusion 314 following manufacture, for example, during operation of the MEMS device 312.

During manufacture, a portion of the protrusion 314, as shown in FIG. 3A may extend to the first substrate 310 thereby coupling or securing the protrusion 314 and the MEMS device 312 to the first substrate 310. The protrusion 314 may extend across a trench 316 to connect the MEMS device 312 to a sidewall of the first substrate 310 adjacent to the MEMS device 312. In an embodiment, the protrusion 314 may be made of a same material as the first substrate 310. The protrusion 314 may stabilize the MEMS device 312 to the first substrate 310 thereby limiting movement of the MEMS device 312 and preventing or reducing stiction of the MEMS device 312 within the structure 300 during manufacture processing of the structure 300. Before manufacture of the structure 300 is completed, the portion of the protrusion 314 connected to the first substrate 310 may be removed.

FIG. 3B illustrates a configuration of the protrusion 314 during operation of the MEMS device 312. The protrusion 314, as shown in FIG. 3B, may have a first surface 314a. The first surface 314a of the protrusion 314 may have a surface area smaller than the first surface 312a of the MEMS device 312. During operation, the protrusion 314 may prevent or reduce stiction between the first surface 312a of the MEMS device 312 and the first substrate 310 for movements or vibrations along a direction perpendicular to the first surface 312a of the MEMS device 312.

Figure 4A:
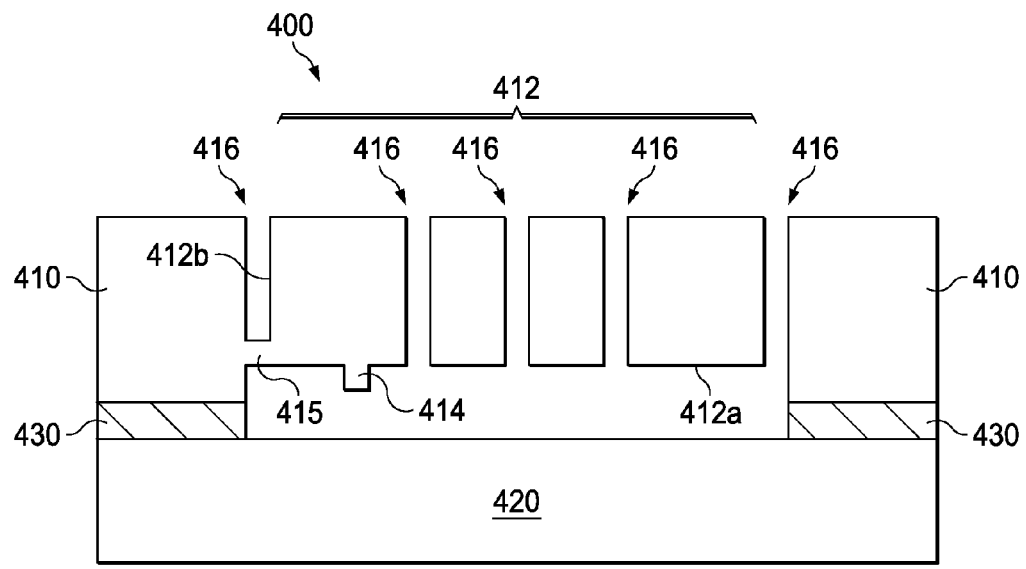
FIGS. 4A-4B illustrate another configuration of another pair of protrusions according to an embodiment.
Figure 4B:
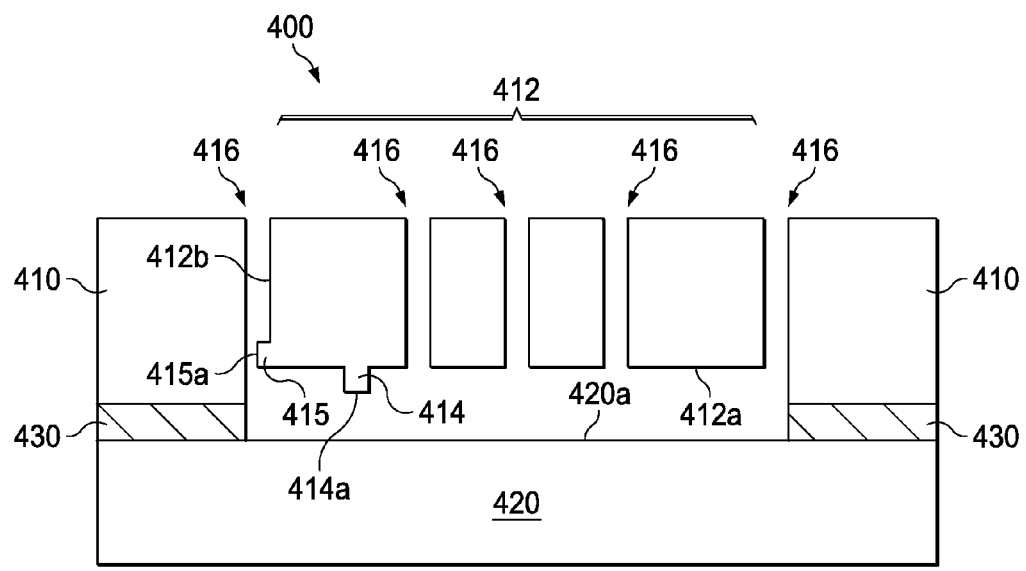

FIGS. 4A-4B illustrate another configuration of another pair of protrusions 414, 415 according to an embodiment. FIG. 4A illustrates a configuration of the pair of protrusions 414, 415 during manufacture of a structure 400. As illustrated in FIGS. 4A-4B, the structure 400 may include a first substrate 410 bonded to a second substrate 420 through a bonding layer 430. The first substrate 410 may include one or more MEMS device(s) 412, a first protrusion 414 extending from a first surface 412a of the MEMS device 412 and a second protrusion 415 extending from a second surface 412b of the MEMS device 412. The MEMS device 412 may have one or more trenches 416 formed therein that may extend through the MEMS device 412.

The second protrusion 415 may prevent or reduce stiction between the MEMS device 412 and the first and second substrate 410, 420 during manufacture of the structure 400. The first and second protrusions 414, 415 may prevent or reduce stiction between the MEMS device 412 and the first and second substrate 410, 420 during operation of the MEMS device 412 following manufacture. FIG. 4B illustrates a configuration of the first and second protrusions 414, 415 following manufacture, for example, during operation of the MEMS device 412.

During manufacture of the structure 400, a portion of the second protrusion 415, as shown in FIG. 4A, may extend to the first substrate 410 thereby coupling or securing the second protrusion 415 and the MEMS device 412 to the first substrate 410. The second protrusion 415 may extend across a trench 416 to connect the MEMS device 412 to a sidewall of the first substrate 410 adjacent to the MEMS device 412. In an embodiment, the second protrusion 415 may be made of a same material as the first substrate 410. The second protrusion 415 may stabilize the MEMS device 412 to the first substrate 410 thereby limiting movement of the MEMS device 412 and preventing or reducing stiction of the MEMS device 412 within the structure 400 during manufacture of the structure 400. Before manufacture of the structure 400 is completed, the portion of the second protrusion 415 connected to the first substrate 410 may be removed.

FIG. 4B illustrates a configuration of the first and second protrusions 414, 415 during operation of the MEMS device 412. The first protrusion 414, as shown in FIG. 4B, may have a first surface 414a. The first surface 414a of the first protrusion 414 may have a surface area smaller than the first surface 412a of the MEMS device 412. During operation, the first protrusion 414 may prevent or reduce stiction between the first surface 412a of the MEMS device 412 and a first surface 420a of the second substrate 420 for movements, vibrations and/or rotation along a direction perpendicular to the first surface 412a of the MEMS device 412.

The second protrusion 415 may have a second surface 415a. The second surface 415a of the second protrusion 415 may have a surface area smaller than the second surface 412b of the MEMS device 412. During operation, the second protrusion 415 may prevent or reduce stiction between the second surface 412b of the MEMS device 412 and the first substrate 410.

Protrusions may be formed in many different configurations. FIGS. 5A-5F illustrate various protrusion configurations according to various embodiments. FIGS. 5A-5F illustrate configurations of various protrusions following manufacture of a corresponding structure, for example, during operation of a MEMS device within a corresponding structure.

Figure 5A:
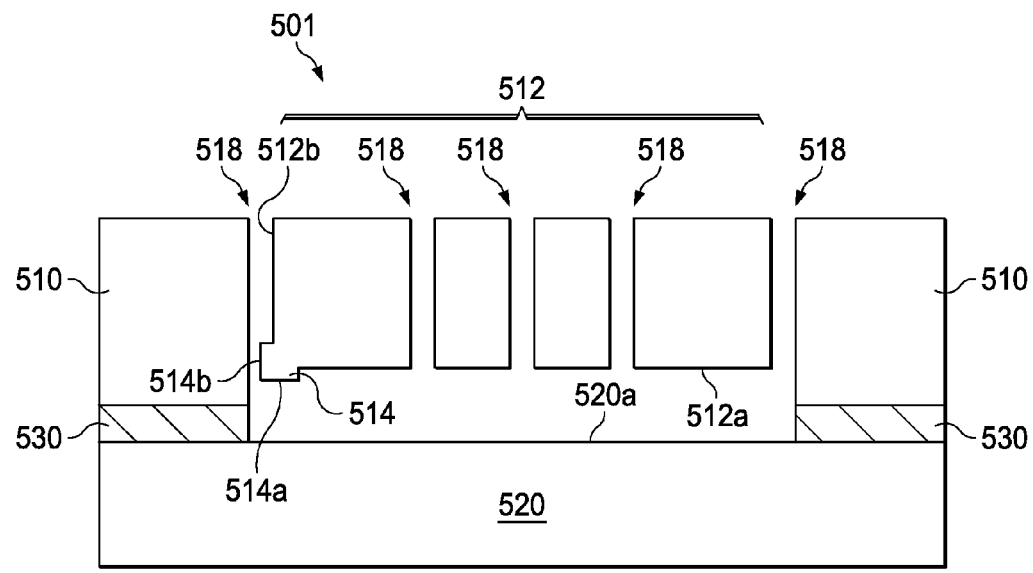
FIGS. 5A-5F illustrate various protrusion configurations according to various embodiments.

FIG. 5A illustrates a structure 501 including a first substrate 510 bonded to a second substrate 520 through a bonding layer 530. The first substrate 510 may include a MEMS device 512 having at least a first surface 512a and a second surface 512b. The MEMS device 512 may include one or more trenches 518. A protrusion 514 may extend from the first and the second surfaces 512a, 512b of the MEMS device 512. The second substrate 520 may have a first surface 520a.

The protrusion 514 may have a first surface 514a for the portion of the protrusion 514 extending from the first surface 512a of the MEMS device 512. The first surface 514a of the protrusion 514 may have a surface area smaller than the first surface 512a of the MEMS device 512. The protrusion 514 may have a second surface 514b for the portion of the protrusion 514 extending from the second surface 512b of the MEMS device 512. The second surface 514b of the protrusion 514 may have a surface area smaller than the second surface 512b of the MEMS device 512. During operation, the protrusion 514 may prevent or reduce stiction between both the first and second surfaces 512a, 512b of the MEMS device 512 and the corresponding first and second substrates 510, 520.

Figure 5B:
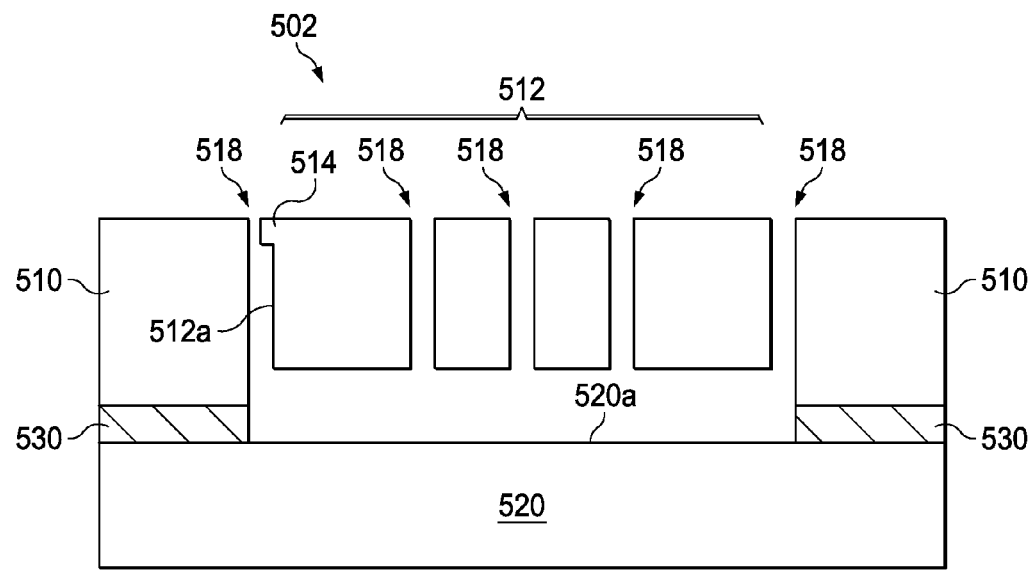

FIG. 5B illustrates a structure 502 including a first substrate 510 bonded to a second substrate 520 through a bonding layer 530. The first substrate 510 may include a MEMS device 512 having at least a first surface 512a. The MEMS device 512 may include one or more trenches 518. A protrusion 514 may extend from the first surface 512a of the MEMS device 512. The second substrate 520 may have a first surface 520a. FIG. 5B illustrates that the protrusion may 514 extend from any portion of the first surface 512a of the MEMS device 512. During operation, the protrusion 514, as illustrated in FIG. 5B, may prevent or reduce stiction between the first surface 512a of the MEMS device 512 and the first substrate 510 for movements or vibrations along a direction perpendicular to the first surface 512a of the MEMS device 512.

Figure 5C:
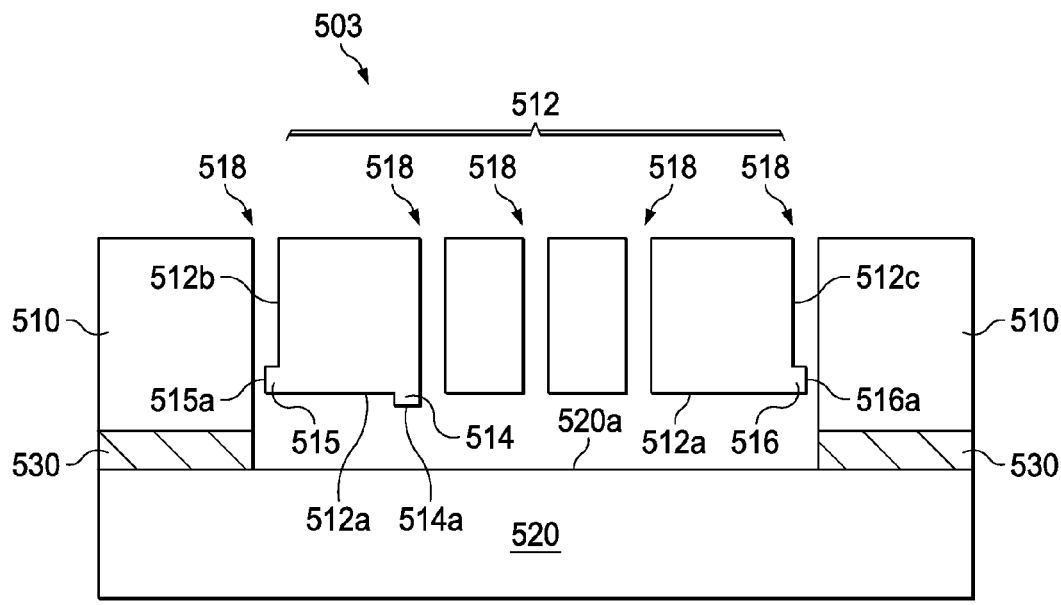

Protrusions may be formed on any surface of a MEMS device. FIG. 5C illustrates a structure 503 including a first substrate 510 bonded to a second substrate 520 through a bonding layer 530. The first substrate 510 may include a MEMS device 512 having at least a first surface 512a, a second surface 512b and a third surface 512c. The MEMS device 512 may include one or more trenches 518. The MEMS device 512 may further include a first protrusion 514 extending from the first surface 512a of the MEMS device 512, a second protrusion 515 extending from the second surface 512b of the MEMS device 512, and a third protrusion 516 extending from the third surface 512c of the MEMS device 512.

The first protrusion 514 may have a first surface 514a, which may have a surface area smaller than that of the first surface 512a of the MEMS device 512. The second protrusion 515 may have a second surface 515a, which may have a surface area smaller than that of the second surface 512b of the MEMS device 512. The third protrusion 516 may have a third surface 516a, which may have a surface area smaller than that of the third surface 512c of the MEMS device 512.

During operation, the first protrusion 514 may prevent or reduce stiction between the first surface 512a of the MEMS device 512 and the second substrate 520. The second and third protrusions 515, 516 may prevent or reduce stiction between the corresponding second and third surfaces 512b, 512c of the MEMS device 512 and the first substrate 510.

Figure 5D:
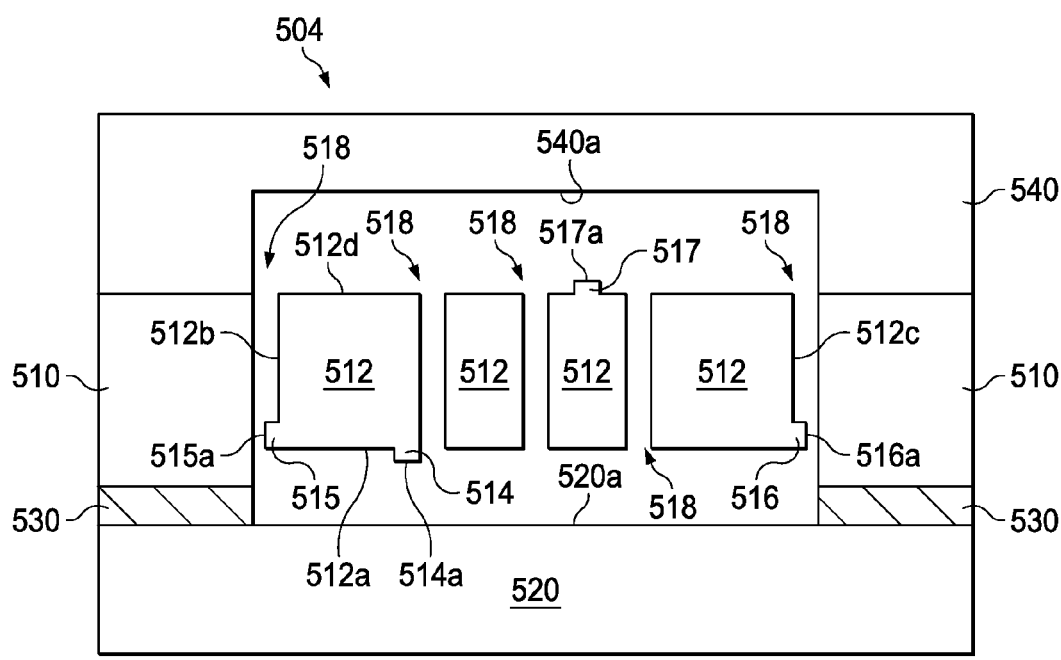

FIG. 5D illustrates a structure 504 including a first substrate 510 bonded to a second substrate 520 through a bonding layer 530. A third substrate 540 may overly and be bonded to the first substrate 510. The third substrate 540 may have a first surface 540a. The third substrate 540 may be bonded to the first substrate 510 through a bonding layer (not shown).

The first substrate 510 may include a MEMS device 512 having a first surface 512a, a second surface 512b, a third surface 512c and a fourth surface 512d. The MEMS device 512 may include one or more trenches 518. The MEMS device 512 may further include: a first protrusion 514 extending from the first surface 512a of the MEMS device 512, a second protrusion 515 extending from the second surface 512b of the MEMS device 512, a third protrusion 516 extending from the third surface 512c of the MEMS device 512, and a fourth protrusion 517 extending the fourth surface 512d of the MEMS device 512.

The first protrusion 514 may have a first surface 514a, which may have a surface area smaller than that of the first surface 512a of the MEMS device 512. The second protrusion 515 may have a second surface 515a, which may have a surface area smaller than that of the second surface 512b of the MEMS device 512. The third protrusion 516 may have a third surface 516a, which may have a surface area smaller than that of the third surface 512c of the MEMS device. The fourth protrusion 517 may have a fourth surface 517a, which may have a surface area smaller than that of the fourth surface 512d of the MEMS device 512.

During operation, the first protrusion 514 may prevent or reduce stiction between the first surface 512a of the MEMS device 512 and the second substrate 520. The second and third protrusions 515, 516 may prevent or reduce stiction between the corresponding second and third surfaces 512b, 512c of the MEMS device 512 and the first substrate 510. The fourth protrusion 517 may prevent or reduce stiction between the fourth surface 512d of the MEMS device 512 and the third surface 540a of the third substrate 540.

Figure 5E:
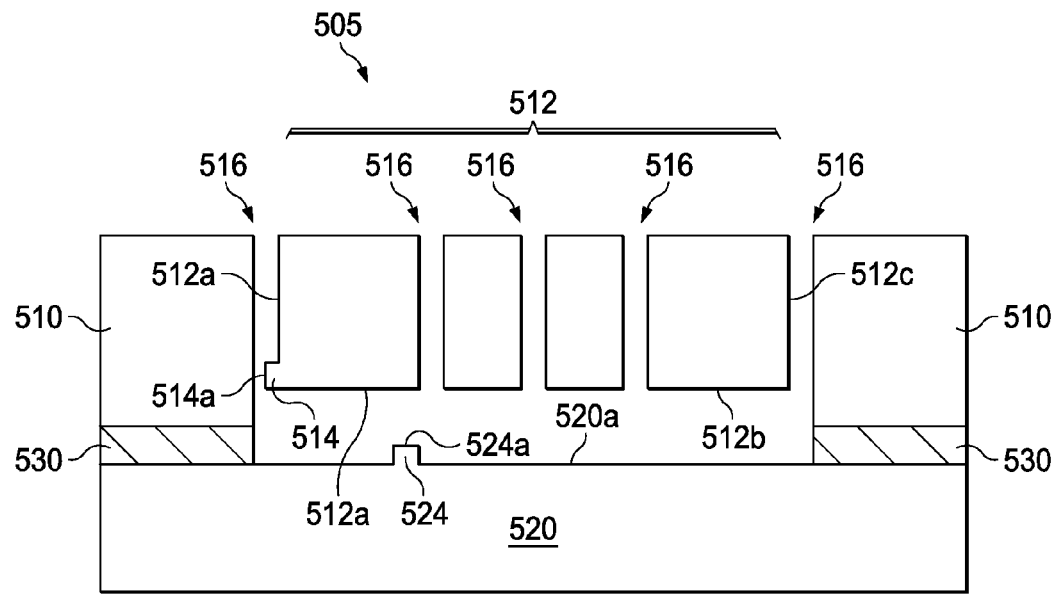

Protrusions need not extend only from a MEMS device. FIG. 5E illustrates a configuration for a pair of protrusions 514, 524 according to an embodiment. As shown in FIG. 5E, a structure 505 may include a first substrate 510 bonded to a second substrate 520 through a bonding layer 530. The first substrate 510 may include a MEMS device 512 having at least a first surface 512a and a second surface 512b. The MEMS device 512 may include one or more trenches 518. A first protrusion 514 may extend from the first surface 512a of the MEMS device 512. The second substrate 520 may have a first surface 520a. A second protrusion 524 may be formed to extend from the first surface 520a of the second substrate 520. In various embodiments, the second protrusion 524 may be formed of a same or a different material than the second substrate 520.

The first protrusion 514 may have a first surface 514a, which may have a surface area smaller than that of the first surface 512a of the MEMS device 512. The second protrusion 524 may have a second surface 524a, which may have a surface area smaller than that of the second surface 512b of the MEMS device 512. During operation, the first protrusion 514 may prevent or reduce stiction between the first surface 512a of the MEMS device 512 and the first substrate 510. The second protrusion 524 may prevent or reduce stiction between the second surface 512b of the MEMS device 512 and the second substrate 520.

Figure 5F:
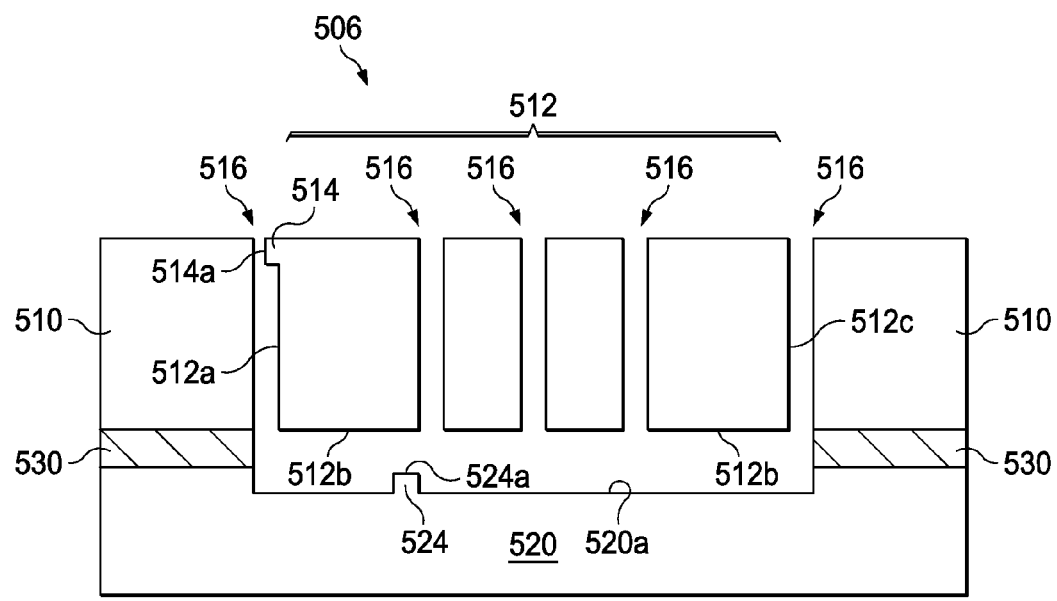

FIG. 5F illustrates a configuration for another pair of protrusions 514, 524 according to an embodiment. As shown in FIG. 5F, a structure 506 may include a first substrate 510 bonded to a second substrate 520 through a bonding layer 530. The first substrate 510 may include a MEMS device 512 having at least a first surface 512a and a second surface 512b. The MEMS device 512 may include one or more trenches 518. A first protrusion 514 may extend from the first surface 512a of the MEMS device 512. The second substrate 520 may have a first surface 520a. A second protrusion 524 may be formed to extend from the first surface 520a of the second substrate 520. In various embodiments, the second protrusion 524 may be formed of a same or a different material than the second substrate 520. In contrast to FIG. 5E, the first surface 520a of the second substrate 520 as illustrated in FIG. 5F may be recessed, which may allow the MEMS device 512 to extend along the entirety of the thickness of the first substrate 510.

The first protrusion 514 may have a first surface 514a, which may have a surface area smaller than that of the first surface 512a of the MEMS device 512. The second protrusion 524 may have a second surface 524a, which may have a surface area smaller than that of the second surface 512b of the MEMS device 512. During operation, the first protrusion 514 may prevent stiction between the first surface 512a of the MEMS device 512 and the first substrate 510. The second protrusion 524 may prevent or reduce stiction between the second surface 512b of the MEMS device 512 and the second substrate 520.

Figure 8:
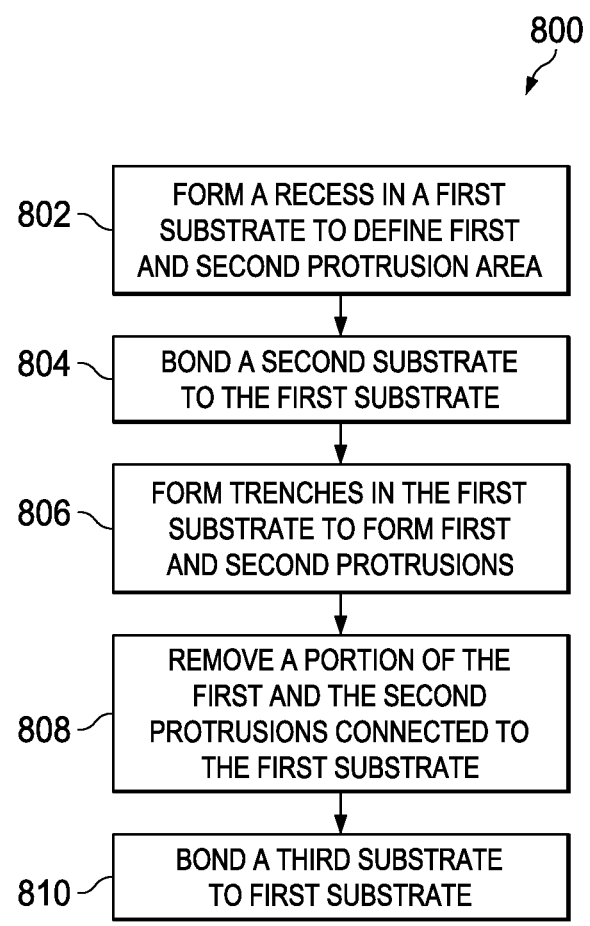
FIG. 8 illustrates a method of the process illustrated in FIGS. 6A-6E in accordance with an embodiment.

FIGS. 6A-6E illustrate various intermediate stages of forming a bonded structure 600 according to an embodiment. FIG. 8 illustrates a method 800 of the process illustrated in FIGS. 6A-6E in accordance with an embodiment.

Figure 6A:
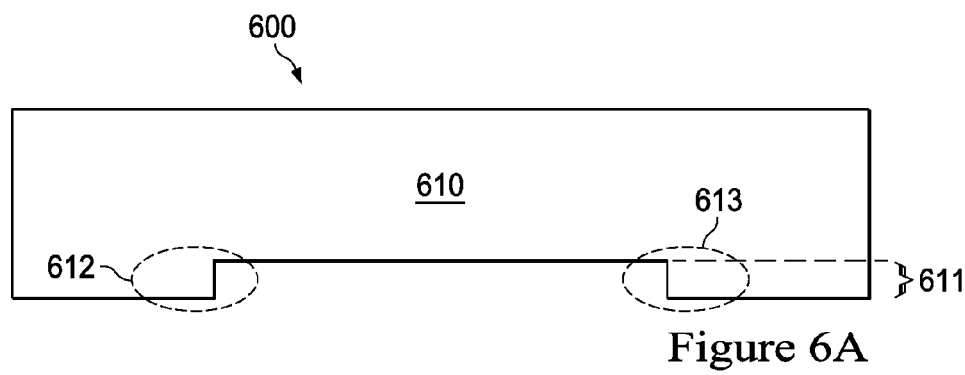
FIGS. 6A-6E illustrate various intermediate stages for forming a bonded structure according to an embodiment.

As illustrated in FIG. 6A, a first recess 611 may be formed in a first substrate 610. The first recess 611 may be formed using one or more subtractive etch processes, the like or other acceptable methods. The first recess 611 may be used to define a first and a second protrusion area 612, 613 that may extend from a first surface of the first recess 611 (block 802).

Figure 6B:
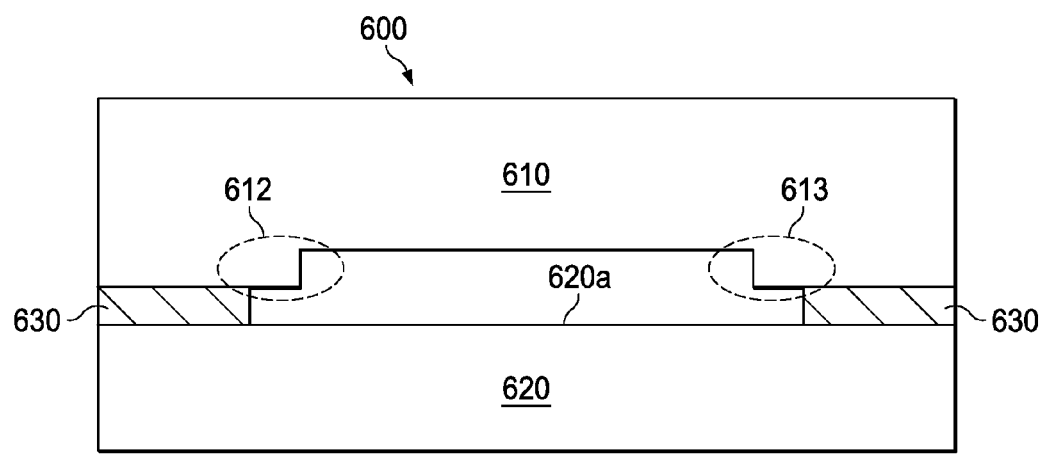

As illustrated in FIG. 6B, the first substrate 610 may be bonded to a second substrate 620 through a first bonding layer 630 (block 804). The second substrate 620 may have a first surface 620a that may be opposite the first and second protrusion areas 612, 613. In various embodiments, the first bonding layer 630 may be formed of a eutectic bonding material such as, for example, a eutectic alloy such as AlCu, AlGe or a low-melting point metal layer tin, silver, gold, lead, aluminum, titanium, copper, lead-free solder, alloys thereof or the like. In various embodiments, the first bonding layer 630 may be formed of a fusion bonding material such as a silicon-based, ceramic-based, quartz-based material or the like. In various embodiments, the first and/or second substrate 610, 620 may be a wafer, die, interposer, any semiconductor substrate, ceramic substrate, quartz substrate, multi-layered substrates, gradient substrates, or hybrid orientation substrates or the like. In some embodiments, the first and/or second substrate 610, 620 may comprise a silicon-on-insulator ("SOI") or other like substrate.

Figure 6C:
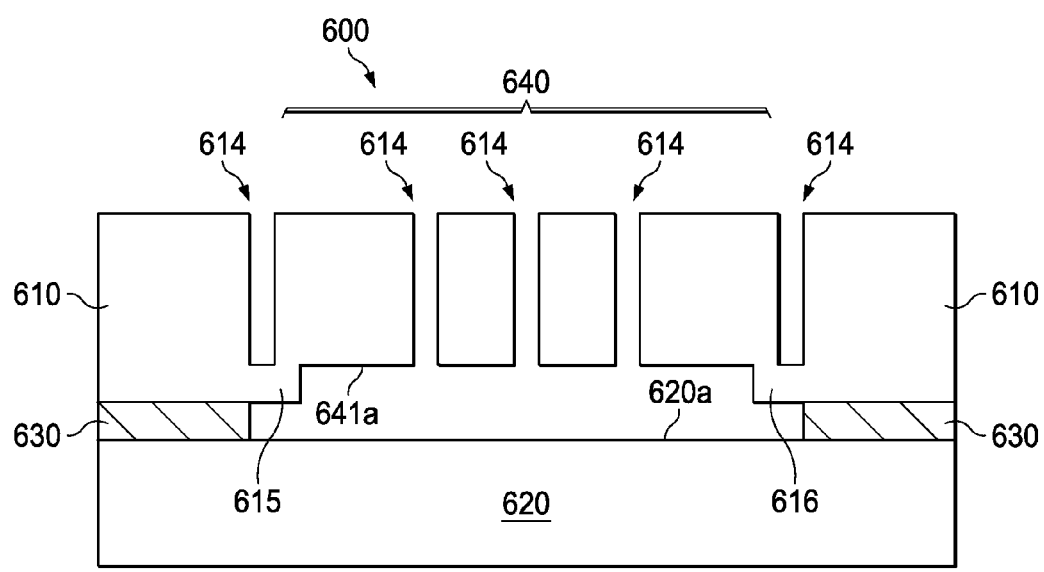

FIG. 6C illustrates one or more trenches 614 that may be formed in the first substrate 610 to define a MEMS device 640 within the first substrate 610. The trenches 614 may be formed using one or more subtractive etch processes, the like or other acceptable methods. As illustrated in FIG. 6C, the trenches 614 may extend through portions of the first substrate 610 to define the MEMS device 640, but may not extend through the first and second protrusion areas 612, 613 of the first substrate 610. As a result, a first protrusion 615 and a second protrusion 616 may be formed (block 806). The first protrusion 615 and the second protrusion 616 may extend from a first surface 641a of the MEMS device 640. A portion of the first protrusion 615 may remain connected to the first substrate 610 during manufacturing. A portion of the second protrusion 616 may remain connected to the first substrate 610 during manufacturing. For example, the first and second protrusion 615, 616 may be connected to opposite sidewalls of the first substrate 610. The first and the second protrusion 615, 616 may stabilize the MEMS device 640 and prevent or reduce stiction between the MEMS device 640 and the first and/or second substrates 610, 620 during manufacturing.

Figure 6D:
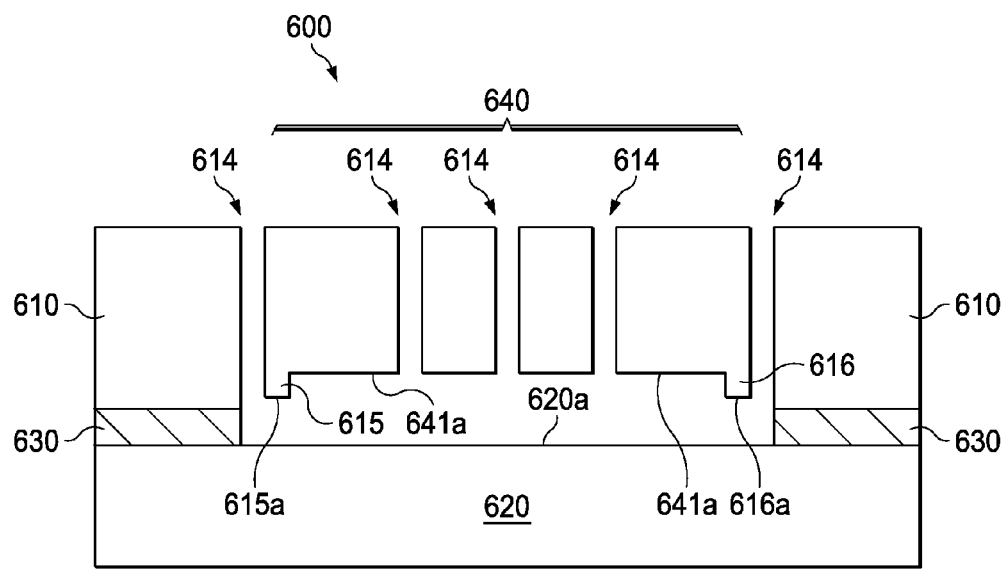

Before manufacturing may be completed, the portion of the first protrusion 615 connected to the first substrate 610 and the portion of the second protrusion 616 connected to the first substrate 610 may be removed, as shown in FIG. 6D (block 808). The first and second portions of the corresponding first and second protrusions 615, 616 may be removed using processes, such as, for example, wet or dry etching, which may include chemical etching, reactive ion etching RIE, combinations thereof or the like. The first protrusion 615 may include a first surface 615a; the first surface 615a may have a surface area smaller than the first surface 641a of the MEMS device 640. The second protrusion 616 may include a second surface 616a; the second surface 616a may have a surface area smaller than the first surface 641a of the MEMS device 640. The first and second protrusions 615, 616 may prevent or reduce stiction between the MEMS device 640 and the first surface 620a of the second substrate 620 during operation of the MEMS device 640.

Figure 6E:
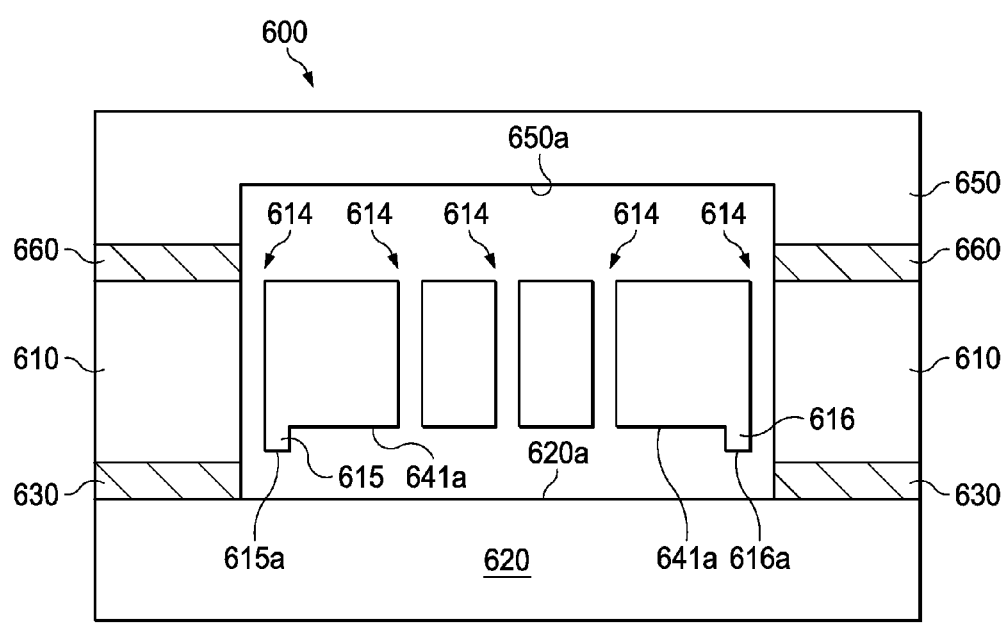

As shown in FIG. 6E, a third substrate 650 may be bonded to the first substrate 610 through a second bonding layer 660 to form the bonded structure 600 (block 810). The third substrate 650 may have a first surface 650a. In various embodiments, the second bonding layer 660 may be formed of a eutectic bonding material such as, for example, a eutectic alloy such as AlCu, AlGe or a low-melting point metal layer tin, silver, gold, lead, aluminum, titanium, copper, lead-free solder, alloys thereof or the like. In various embodiments, the second bonding layer 660 may be formed of a fusion bonding material such as a silicon-based, ceramic-based, quartz-based material or the like. In various embodiments, the third substrate 650 may be a wafer, die, interposer, any semiconductor substrate, ceramic substrate, quartz substrate, multi-layered substrates, gradient substrates, or hybrid orientation substrates or the like. In some embodiments, the third substrate 650 may comprise a silicon-on-insulator ("SOI") or other like substrate.

Figure 7A:
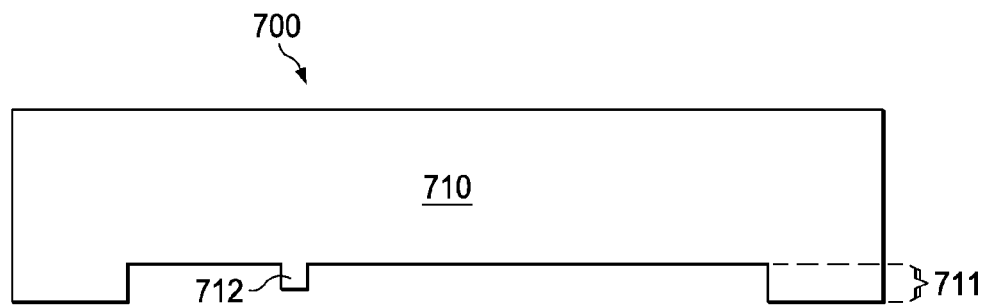
FIGS. 7A-7D illustrates other various intermediate stages for forming a bonded structure an embodiment.

FIGS. 7A-7D illustrates other various intermediate stages for forming a bonded structure 700 according to an embodiment. As illustrated in FIG. 7A, a first recess 711 may be formed in a first substrate 710. The first recess 711 may be formed using one or more subtractive etch processes, the like or other acceptable methods. The recess 711 may be used to define a first protrusion 712 that may extend from a first surface of the first recess 711.

Figure 7B:
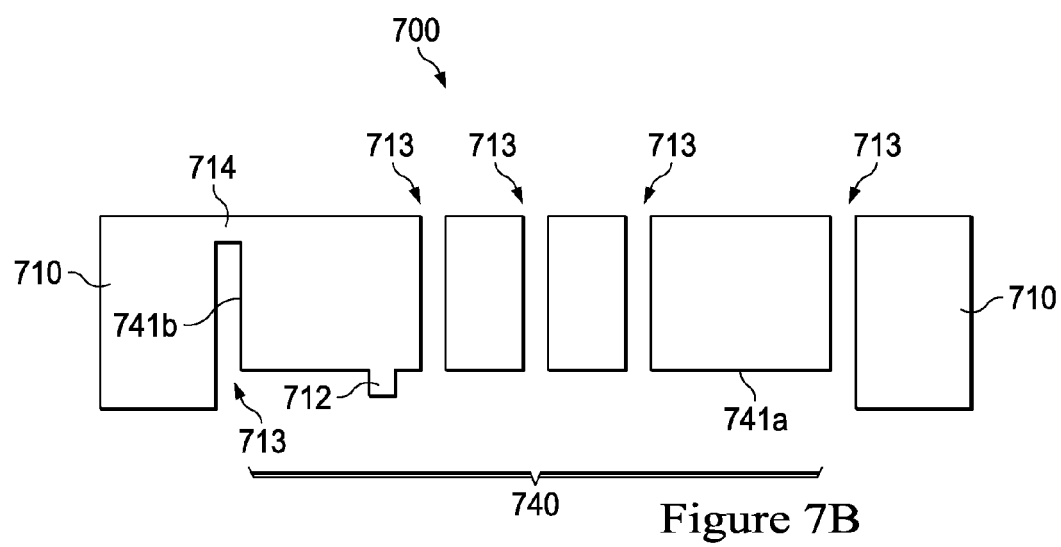

As shown in FIG. 7B, one or more trenches 713 may be formed in the first substrate 710. The one or more trenches 713 may be formed to extend through the first substrate 710, which may define a MEMS device 740 within the first substrate 710. In an embodiment, the first substrate 710 may be temporarily mounted to a handle or support wafer (not shown) in order to form the one or more trenches 713; the handle or support wafer may be removed after bonding the first substrate to another wafer. As shown in FIG. 7B, the first protrusion 712 may extend a first surface 741a of the MEMS device 740. The one or more trenches 713 may also be formed to define a second protrusion 714 that may extend from a second surface 741b of the MEMS device 740. The one or more trenches 713 may be formed using multiple subtractive etch processes, the like or other acceptable methods.

A portion of the second protrusion 714 may remain connected to the first substrate 710 during manufacturing. The second protrusion 714 may stabilize the MEMS device 740 and prevent or reduce stiction of the MEMS device 740 to the first and/or second substrates 710, 720 during manufacturing.

Figure 7C:
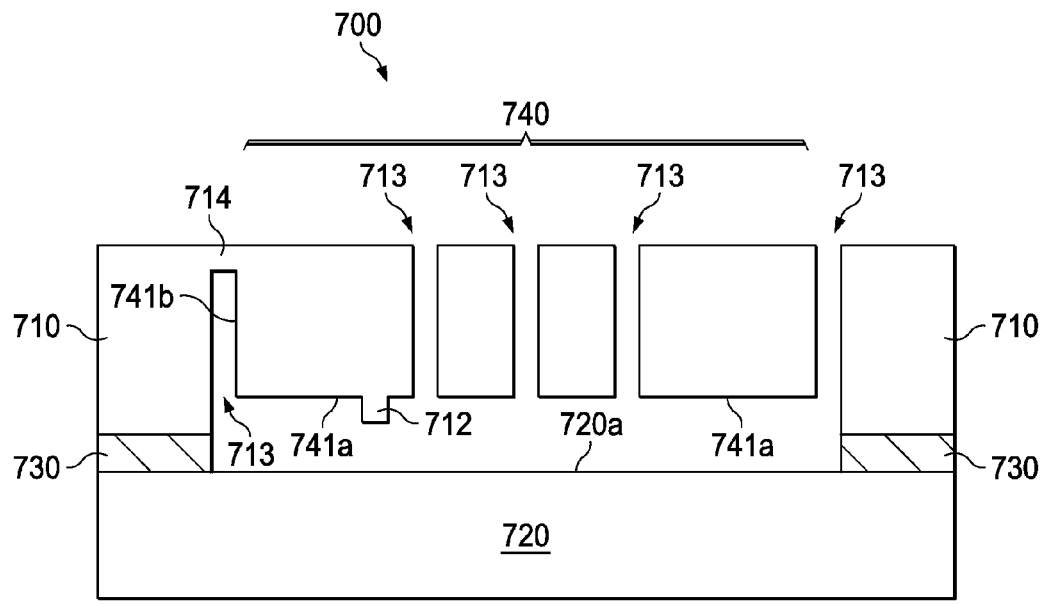

As shown in FIG. 7C, the first substrate 710 may be bonded to a second substrate 720 through a first bonding layer 730 to form the bonded structure 700. The second substrate 720 may have a first surface 720a. In various embodiments, the first bonding layer 730 may be formed of a eutectic bonding material such as, for example, a eutectic alloy such as AlCu, AlGe or a low-melting point metal layer tin, silver, gold, lead, aluminum, titanium, copper, lead-free solder, alloys thereof or the like. In various embodiments, the first bonding layer 730 may be formed of a fusion bonding material such as a silicon-based, ceramic-based, quartz-based material or the like. In various embodiments, the first and/or second substrate 710, 720 may be a wafer, die, interposer, any semiconductor substrate, ceramic substrate, quartz substrate, multi-layered substrates, gradient substrates, or hybrid orientation substrates or the like. In some embodiments, the first and/or second substrate 710, 720 may comprise a silicon-on-insulator ("SOI") or other like substrate.

Figure 7D:
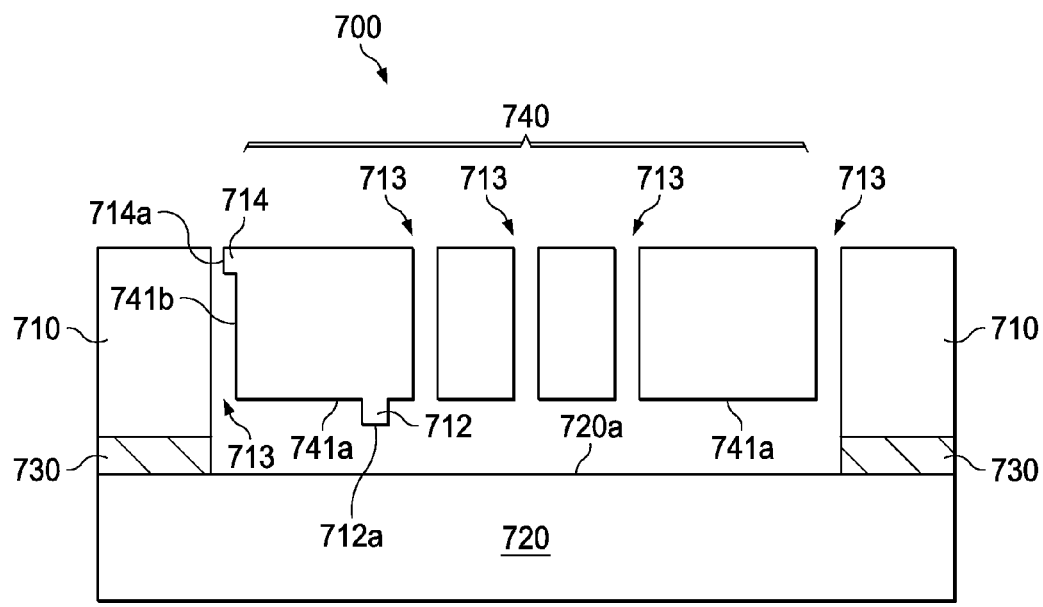

Before manufacturing may be completed, the portion of the second protrusion 714 connected to the first substrate 710 may be removed, as shown in FIG. 7D. The portion of the second protrusion 714 may be removed using processes, such as, for example, wet or dry etching, which may include chemical etching, reactive ion etching RIE, combinations thereof or the like. The second protrusion 714 may include a second surface 714a; the second surface 714a may have a surface area smaller than the second surface 741b of the MEMS device 740. The first protrusion 712 may include a first surface 712a. The first surface 712a may have a surface area smaller than the first surface 741a of the MEMS device 740. The first and second protrusions 712, 714 may prevent or reduce stiction between the MEMS device 740 and the first and second substrates 710, 720 during operation of the MEMS device 740.

In an embodiment, a method is provided. The method may comprise forming a MEMS device in a first substrate, the MEMS device having a first surface; forming a first protrusion in a first opening of the MEMS device to extend from the first surface of the MEMS device across the first opening to connect to a sidewall of the substrate adjacent to the MEMS device; bonding the first substrate to a second substrate, the second substrate having a first surface; and removing at least a portion of the first protrusion following the bonding the first substrate to the second substrate.

In an embodiment, another method is provided. The method may comprise forming a MEMS device in a first substrate, the MEMS device having a first surface, a second surface and a third surface; forming a first protrusion to extend from the first surface of the MEMS device, a portion of the first protrusion connecting the MEMS device to a sidewall of the first substrate; forming a second protrusion to extend from the second surface of the MEMS device; bonding the first substrate to a second substrate, the second substrate having a first surface; removing the portion of the first protrusion connecting the MEMS device to the first substrate following the bonding the first substrate to the second substrate, the removing allowing the MEMS device to move; and bonding a third substrate to the first substrate, the third substrate having a first surface opposite the third surface of the MEMS device.

In an embodiment, an apparatus is provided. The apparatus may comprise a first substrate having formed therein a MEMS device, the MEMS device having a first surface and a second surface; a first protrusion extending from the first surface of the MEMS device, the first protrusion having a portion extending across an opening in the MEMS device; a second substrate bonded to the first substrate, the second substrate having a first surface opposite the second surface of the MEMS device; and a second protrusion extending from the first surface of the second substrate, the second protrusion having a first surface, wherein the first surface of the second protrusion is smaller than the second surface of the MEMS device.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    forming a MEMS device in a first substrate, the first substrate having a first surface and a second surface opposing the first surface, the first surface of the first substrate having a recess, the MEMS device being formed in the recess, the MEMS device having a first surface, the first surface of the MEMS device extending in a direction that is parallel to the first surface of the first substrate, the first surface of the MEMS device being between the first surface of the first substrate and the second surface of the first substrate;
    forming a trench in the second surface of the first substrate, the trench having a first sidewall and a second sidewall opposing the first sidewall, wherein a region of the first substrate at a bottom of the trench and extending from the first sidewall of the trench to the second sidewall of the trench forms a first protrusion, wherein a first thickness of the first protrusion, measured along a first direction perpendicular to the first surface of the MEMS device, is different from a second thickness of the MEMS device measured along the first direction;
    bonding the first substrate to a second substrate, the first surface of the first substrate being interposed between the second surface of the first substrate and the second substrate; and
    after bonding the first substrate to the second substrate, extending the trench through the first substrate to remove at least a portion of the first protrusion, wherein after removing the at least the portion of the first protrusion, the first protrusion comprises a sidewall that is connected to a sidewall of the MEMS device, wherein the sidewall of the first protrusion and the sidewall of the MEMS device are made of a same material, wherein a sidewall of the first substrate exposed by the trench extends along a straight line from the first surface of the first substrate to the second surface of the first substrate.

2. The method of claim 1, further comprising:
    forming a second protrusion on the second substrate, wherein the second protrusion is opposite to and separated from the first surface of the MEMS device.

3. The method of claim 1, further comprising:
    forming a second protrusion to extend from the first surface of the MEMS device across an opening to connect to another sidewall of the first substrate adjacent to the MEMS device.

4. The method of claim 3, wherein the second protrusion is opposite to and separated from the second substrate.

5. The method of claim 3, further comprising:
    removing at least a portion of the second protrusion connected to the first substrate following the bonding the first substrate to the second substrate.

6. The method of claim 1, further comprising:
    forming a second protrusion to extend from a second surface of the MEMS device.

7. The method of claim 1, further comprising bonding a third substrate to the first substrate following the bonding the first substrate to the second substrate.

8. The method of claim 7, further comprising:
    before bonding the third substrate to the first substrate, forming a second protrusion to extend from a second surface of the MEMS device, wherein, after bonding the third substrate to the first substrate, the second surface of the MEMS device is opposite to the third substrate.

9. The method according to claim 1, wherein a sidewall of the recess is laterally disposed between a first opening of the MEMS device and the first sidewall of the trench, the first opening extending from the second surface of the first substrate to the first surface of the MEMS device.

10. The method according to claim 1, wherein after the trench is formed, the bottom of the trench is planar with the first surface of the MEMS device.

11. A method comprising:
    forming a MEMS device in a first substrate, the MEMS device having a first surface, a second surface and a third surface, wherein the first surface and the third surface are parallel;
    forming a first protrusion to extend from the second surface of the MEMS device, a portion of the first protrusion connecting the MEMS device to a sidewall of the first substrate, where the first protrusion has a first thickness different from a second thickness of the MEMS device, wherein the first thickness and the second thickness are measured along a direction perpendicular to the first surface of the MEMS device;
    forming a second protrusion to extend from the first surface of the MEMS device;
    bonding the first substrate to a second substrate;
    removing the portion of the first protrusion connecting the MEMS device to the first substrate following the bonding the first substrate to the second substrate, the removing allowing the MEMS device to move, wherein after the portion of the first protrusion is removed the first protrusion comprises a top surface and a bottom surface, the top surface and the bottom surface each extending in a direction that is parallel to the first surface, the top surface and the bottom surface extending along an opening adjacent to the MEMS device, and the top surface and the bottom surface being made of a same material; and
    bonding a third substrate to the first substrate, the third substrate having a fourth surface opposite the third surface of the MEMS device.

12. The method of claim 11, further comprising:
    forming a third protrusion on the second substrate, wherein the third protrusion is separated from the second surface of the MEMS device.

13. The method of claim 11, further comprising:
    forming a third protrusion to extend from a fifth surface of the MEMS device, a portion of the third protrusion connecting the MEMS device to another sidewall of the first substrate; and
    removing the portion of the third protrusion connecting the MEMS device to the first substrate following the bonding the first substrate to the second substrate, the removing allowing the MEMS device to move.

14. The method of claim 11, further comprising:
forming a third protrusion to extend from the third surface of the MEMS device prior to the bonding the third substrate to the first substrate.

15. The method of claim 11, wherein the first protrusion and the first substrate comprise a same material.

16. The method of claim 11, wherein the first surface of the MEMS device is between the third surface of the MEMS device and a lower side of the first substrate facing the second substrate, wherein an upper side of the first substrate is level with the third surface of the MEMS device, wherein the sidewall of the first substrate is straight and extends from the upper side of the first substrate to the lower side of the first substrate.

17. An apparatus comprising:
a first substrate having formed therein a MEMS device, the MEMS device having a first surface, a second surface and a third surface, the third surface being level with a major surface of the first substrate and the second surface being parallel to another major surface of the first substrate;
a first protrusion extending from the first surface of the MEMS device, the first protrusion having a portion extending into an opening adjacent to the MEMS device, wherein a sidewall of the first substrate that is opposite to the first protrusion across the opening in the MEMS device extends in a straight line from the major surface of the first substrate to the another major surface of the first substrate, the sidewall of the first substrate being made of a same material between the major surface and the another major surface, wherein a thickness of the first protrusion, measured along a first direction parallel to the sidewall of the first substrate, is smaller than a thickness of the MEMS device measured along the first direction, and wherein the opening extends from the major surface to the another major surface of the first substrate;
a second substrate bonded to the first substrate, the second substrate having a fourth surface opposite the second surface of the MEMS device; and
a second protrusion extending from the fourth surface of the second substrate, the second protrusion having a fifth surface, wherein the fifth surface of the second protrusion is smaller than the second surface of the MEMS device.

18. The apparatus of claim 17, wherein the second protrusion is separated from the second surface of the MEMS device.

19. The apparatus of claim 17, further comprising:
a third protrusion extending from a sixth surface of the MEMS device, the third protrusion having a seventh surface, wherein the seventh surface of the third protrusion is smaller than the sixth surface of the MEMS device.

20. The apparatus of claim 17, wherein a lower side of the first protrusion is level with the second surface of the MEMS device.

* * * * *